(12) United States Patent
Tran et al.

(10) Patent No.: US 9,620,216 B2
(45) Date of Patent: Apr. 11, 2017

(54) FLASH MEMORY DEVICE CONFIGURABLE TO PROVIDE READ ONLY MEMORY FUNCTIONALITY

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 33 days.

(21) Appl. No.: 14/624,476

(22) Filed: Feb. 17, 2015

(65) Prior Publication Data

US 2016/0240255 A1   Aug. 18, 2016

(51) Int. Cl.
| | |
|---|---|
| *G11C 16/08* | (2006.01) |
| *G11C 17/08* | (2006.01) |
| *G11C 16/22* | (2006.01) |
| *G11C 16/14* | (2006.01) |
| *G11C 16/26* | (2006.01) |

(52) U.S. Cl.
CPC ............ *G11C 16/08* (2013.01); *G11C 16/14* (2013.01); *G11C 16/22* (2013.01); *G11C 16/26* (2013.01); *G11C 17/08* (2013.01); *G11C 2216/26* (2013.01)

(58) Field of Classification Search
CPC ......... G11C 16/08; G11C 16/04; G11C 16/22; G11C 16/26
See application file for complete search history.

(56) References Cited

U.S. PATENT DOCUMENTS

| | | | | |
|---|---|---|---|---|
| 6,687,154 | B2* | 2/2004 | Lee | G11C 11/005 257/E21.672 |
| 7,031,188 | B2* | 4/2006 | Lee | G11C 16/22 365/185.01 |
| 7,608,882 | B2* | 10/2009 | Lung | H01L 21/28282 257/314 |

* cited by examiner

*Primary Examiner* — Tri Hoang
(74) *Attorney, Agent, or Firm* — DLA Piper LLP (US)

(57) ABSTRACT

The disclosed embodiments comprise a flash memory device that can be configured to operate as a read only memory device. In some embodiments, the flash memory device can be configured into a flash memory portion and a read only memory portion.

40 Claims, 11 Drawing Sheets

FLASH MEMORY DEVICE CONFIGURABLE TO PROVIDE READ ONLY MEMORY FUNCTIONALITY

TECHNICAL FIELD

The disclosed embodiments comprise a flash memory device that can be configured to operate as a read only memory device. In some embodiments, the flash memory device can be configured into a flash memory portion with variable flash array size and a read only memory (ROM) portion with variable ROM array size.

BACKGROUND OF THE INVENTION

Non-volatile memory cells are well known in the art. One prior art non-volatile split gate memory cell 10 is shown in FIG. 1. The memory cell 10 comprises a semiconductor substrate 12 of a first conductivity type, such as P type. The substrate 12 has a surface on which there is formed a first region 14 (also known as the source line SL) of a second conductivity type, such as N type. A second region 16 (also known as the drain line) also of N type is formed on the surface of the substrate 12. Between the first region 14 and the second region 16 is a channel region 18. A bit line BL 20 is connected to the second region 16. A word line WL 22 is positioned above a first portion of the channel region 18 and is insulated therefrom. The word line 22 has little or no overlap with the second region 16. A floating gate FG 24 is over another portion of the channel region 18. The floating gate 24 is insulated therefrom, and is adjacent to the word line 22. The floating gate 24 is also adjacent to the first region 14. The floating gate 24 may overlap the first region 14 to provide coupling from the region 14 into the floating gate 24. A coupling gate CG (also known as control gate) 26 is over the floating gate 24 and is insulated therefrom. An erase gate EG 28 is over the first region 14 and is adjacent to the floating gate 24 and the coupling gate 26 and is insulated therefrom. The top corner of the floating gate 24 may point toward the inside corner of the T-shaped erase gate 28 to enhance erase efficiency. The erase gate 28 is also insulated from the first region 14. The cell 10 is more particularly described in U.S. Pat. No. 7,868,375 whose disclosure is incorporated herein by reference in its entirety.

One exemplary operation for erase and program of prior art non-volatile memory cell 10 is as follows. The cell 10 is erased, through a Fowler-Nordheim tunneling mechanism, by applying a high voltage on the erase gate 28 with other terminals equal to zero volt. Electrons tunnel from the floating gate 24 into the erase gate 28 causing the floating gate 24 to be positively charged, turning on the cell 10 in a read condition. The resulting cell erased state is known as '1' state. The cell 10 is programmed, through a source side hot electron programming mechanism, by applying a high voltage on the coupling gate 26, a high voltage on the source line 14, a medium voltage on the erase gate 28, and a programming current on the bit line 20. A portion of electrons flowing across the gap between the word line 22 and the floating gate 24 acquire enough energy to inject into the floating gate 24 causing the floating gate 24 to be negatively charged, turning off the cell 10 in read condition. The resulting cell programmed state is known as '0' state.

Read only memory devices also are known in the prior art that is typically implemented by a mask such as by BEOL (back end of line) mask such as metal or contact mask. Some read only memory devices store data permanently and can be written to only once. Other read only memory devices, such as EPROMs (erasable programmable read only memories) and EEPROMs (electrically erasable programmable read only memories) can be written to, then erased using a special mechanism and then written to again. This sequence can be repeated indefinitely.

However, the prior art does not contain a flash memory devices that can operate as a read only memory device, or which can be partitioned electrically in real time to provide a variable flash memory portion and a variable read only memory portion.

What is needed is a design that enables a flash memory device to be used as a read only memory device. What is further needed is a design that allows for the configuration of the device to establish a portion of the flash memory device that will be used as a flash memory portion and another portion that will be used as a read only memory portion.

SUMMARY OF THE INVENTION

The disclosed embodiments comprise a flash memory device that can be configured to operate as a read only memory device. In some embodiments, the flash memory device can be configured into a flash memory portion and a read only memory portion.

DETAILED DESCRIPTION OF THE PREFERRED EMBODIMENT

Figure 1:
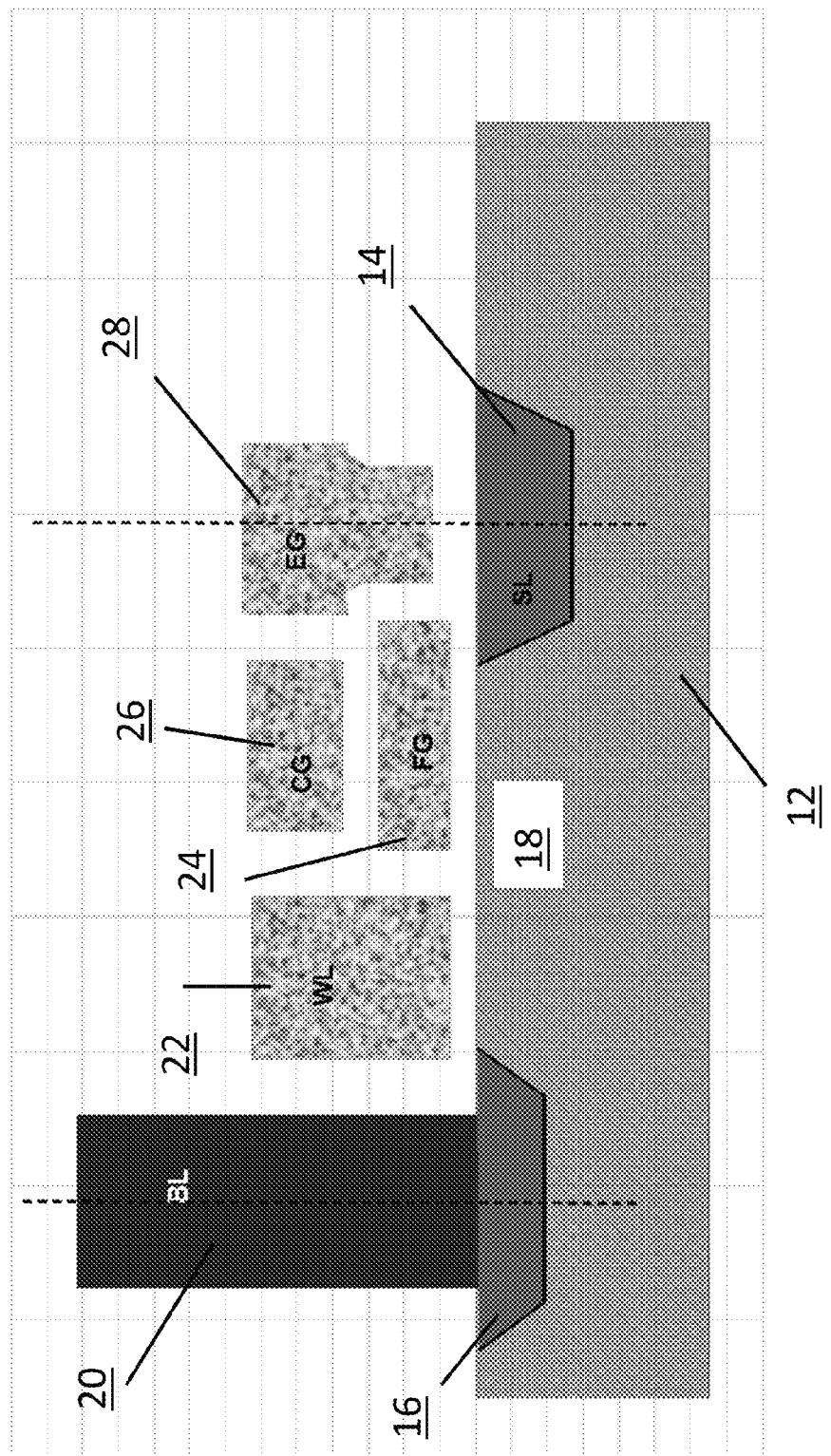
FIG. 1 is a cross-sectional view of a non-volatile memory cell of the prior art to which the method of the present invention can be applied.
Figure 2:
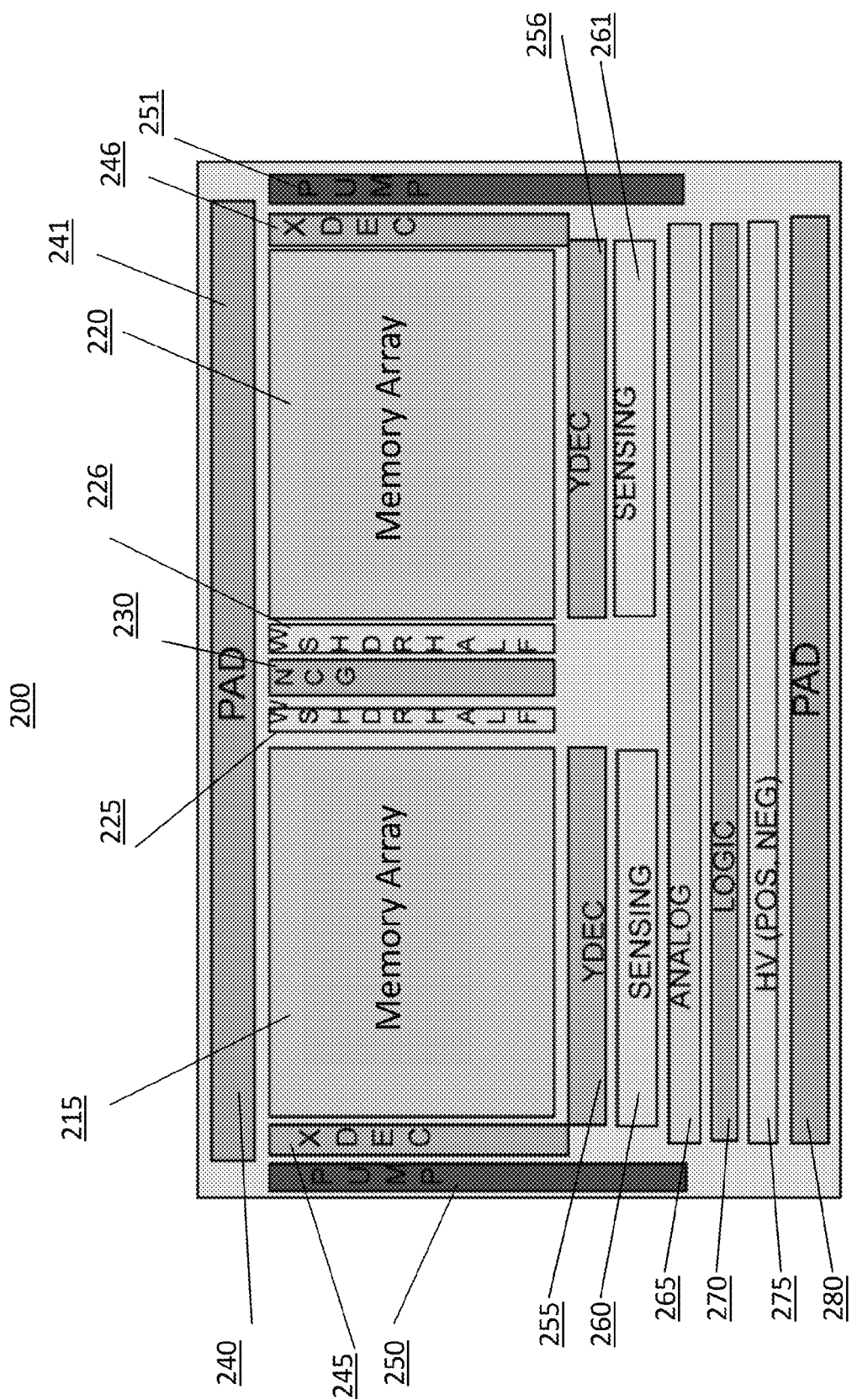
FIG. 2 is a block diagram of a non-volatile memory device using the non-volatile memory cell of the prior art shown in FIG. 1.

FIG. 2 depicts an embodiment of an architecture for a flash memory system comprising die 200. Die 200 comprises: memory array 215 and memory array 220 for storing data, memory arrays 215 and 220 comprising rows and columns of memory cells of the type described previously as memory cell 10 in FIG. 1, pad 240 and pad 280 for enabling electrical communication between the other components of die 200 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 275 used to provide positive and negative voltage supplies for the system; control logic 270 for providing various control functions, such as redundancy and built-in self-testing; analog circuit 265; sensing circuits 260 and 261 used to read data from memory array 215 and memory array 220, respectively; row decoder circuit 245 and row decoder circuit 246 used to access the row in memory array 215 and memory array 220, respectively, to be read from or written to; column decoder circuit 255 and column decoder circuit 256 used to access bytes in memory array 215 and memory array 220, respectively, to be read from or written to; charge pump circuit 250 and charge pump circuit 251, used to provide increased voltages for program and erase operations for memory array 215 and memory array 220, respectively; negative voltage driver circuit 230 shared by memory array 215 and memory array 220 for read and write operations; high voltage driver circuit 225 used by memory array 215 during read and write operations and high voltage driver circuit 226 used by memory array 220 during read and write operations.

In response to the read, erase or program command, the logic circuit 270 causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

The method of performing read, erase, and program operations for selected memory cell 10 or unselected memory cell 10 involves applying the following voltages:

| Operation #1: PEO (positive erase operation) table | | | | | |
|---|---|---|---|---|---|
|  | WL | WL-unsel | BL | BL-unsel | CG | CG -unsel same sector |
| Read | 1.0-2 V | 0 V | 0.6-2 V | 0 V | 0-2.6 V | 0-2.6 V |
| Erase | 0 V | 0 V | 0 V | 0 V | 0 V | 0-2.6 V |
| Program | 1 V | 0 V | 1 uA | Vinh | 10-11 V | 0-2.6 V |

|  | CG -unsel | EG | EG-unsel | SL | SL-unsel |
|---|---|---|---|---|---|
| Read | 0-2.6 V | 0-2.6 V | 0-2.6 V | 0 V | 0 V |
| Erase | 0-2.6 V | 11.5-12 V | 0-2.6 V | 0 V | 0 V |
| Program | 0-2.6 V | 4.5-5 V | 0-2.6 V | 4.5-5 V | 0-1 V |

In one embodiment, negative voltages can be applied to word line 22 when memory cell 10 is unselected during read and program operations, such that the following voltages are applied:

| Operation #2: PEO (positive erase operation) table | | | | | | |
|---|---|---|---|---|---|---|
|  | WL | WL - unsel | BL | BL - unsel | CG | CG -unsel same sector |
| Read | 1.0-2 V | −0.5 V/0 V | 0.6-2 V | 0 V | 0-2.6 V | 0-2.6 V |
| Erase | 0 V | 0 V | 0 V | 0 V | 0 V | 0-2.6 V |
| Program | 1 V | −0.5 V/0 V | 1 uA | Vinh | 10-11 V | 0-2.6 V |

|  | CG - unsel | EG | EG-unsel | SL | SL-unsel |
|---|---|---|---|---|---|
| Read | 0-2.6 V | 0-2.6 V | 0-2.6 V | 0 V | 0 V |
| Erase | 0-2.6 V | 11.5-12 V | 0-2.6 V | 0 V | 0 V |
| Program | 0-2.6 V | 4.5-5 V | 0-2.6 V | 4.5-5 V | 0-1 V |

In another embodiment, negative voltages can be applied to word line 22 when memory cell 10 is unselected during read, erase, and program operations, and negative voltages can be applied to coupling gate 26 during an erase operation, such that the following voltages are applied:

| Operation #3: PNEO (positive negative erase operation) table | | | | | | |
|---|---|---|---|---|---|---|
|  | WL | WL - unsel | BL | BL - unsel | CG | CG -unsel same sector |
| Read | 1.0-2 V | −0.5 V/0 V | 0.6-2 V | 0-Float V | 0-2.6 V | 0-2.6 V |
| Erase | 0 V | −0.5 V/0 V | 0 V | 0-Float V | −(4-9) V | 0-2.6 V |
| Program | 1 V | −0.5 V/0 V | 0.1-1 uA | Vinh | 8-9 V | 0-2.6 V |

|  | CG - unsel | EG | EG-unsel | SL | SL-unsel |
|---|---|---|---|---|---|
| Read | 0-2.6 V | 0-2.6 V | 0-2.6 V | 0 V | 0-0.5 V |
| Erase | 0-2.6 V | 8-9 V | 0-2.6 V | 0 V | 0-1 V |
| Program | 0-2.6 V | 5-9 V | 0-2.6 V | 4.5-5 V | 0-1 V |

Figure 3:
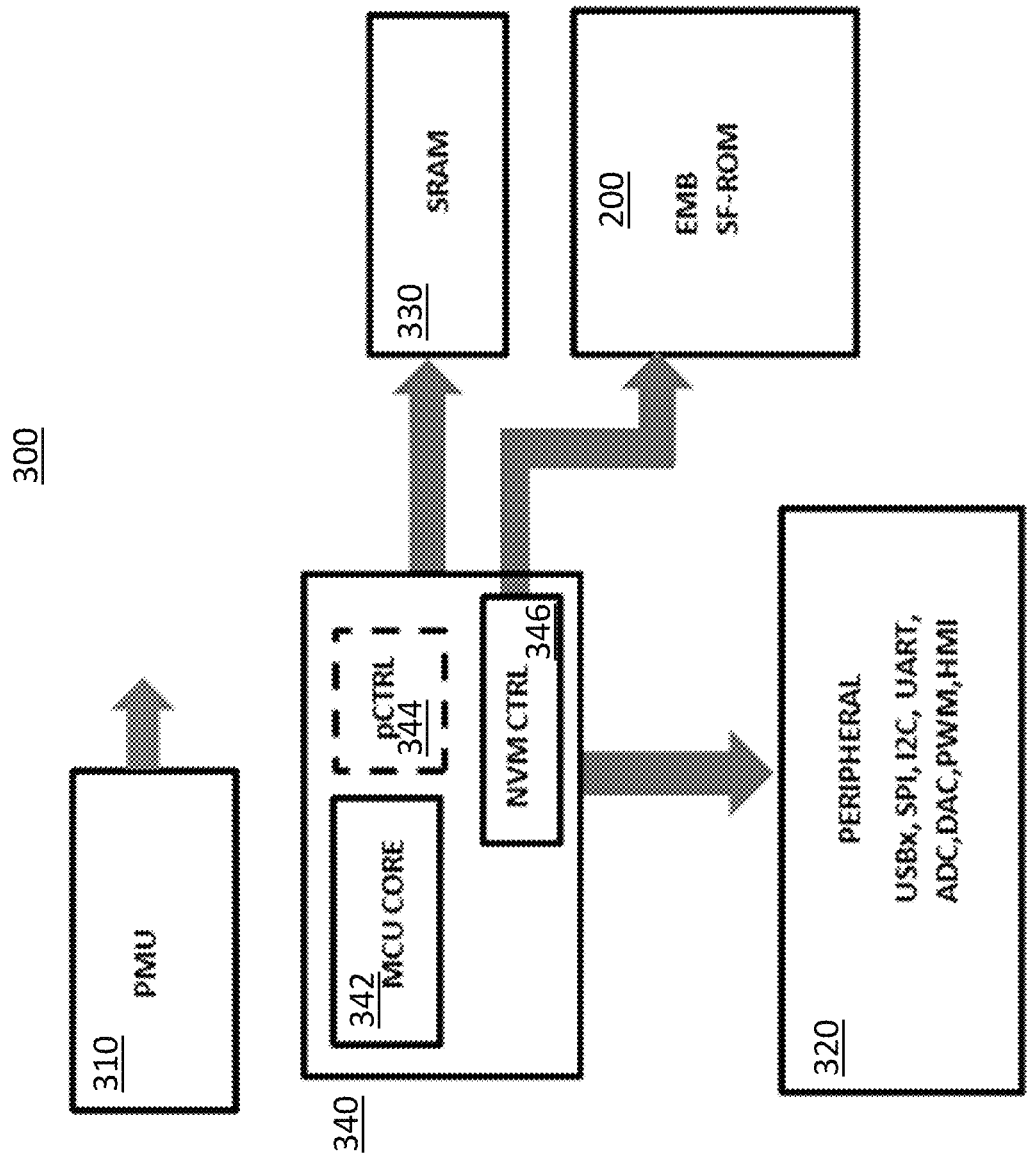
FIG. 3 depicts a system that utilizes a flash memory device that is configured to provide read only memory functionality.

FIG. 3 depicts system 300. System 300 comprises power management unit 310, peripheral devices 320 (such as USB controllers, SPI controllers, etc.), SRAM 330, and controller 340. Controller 340 comprises microcontroller core 342, memory controller 344, and non volatile memory controller 346. System 300 further comprises die 200 from FIG. 1. Non volatile memory controller 346 interacts die 200.

Figure 4:
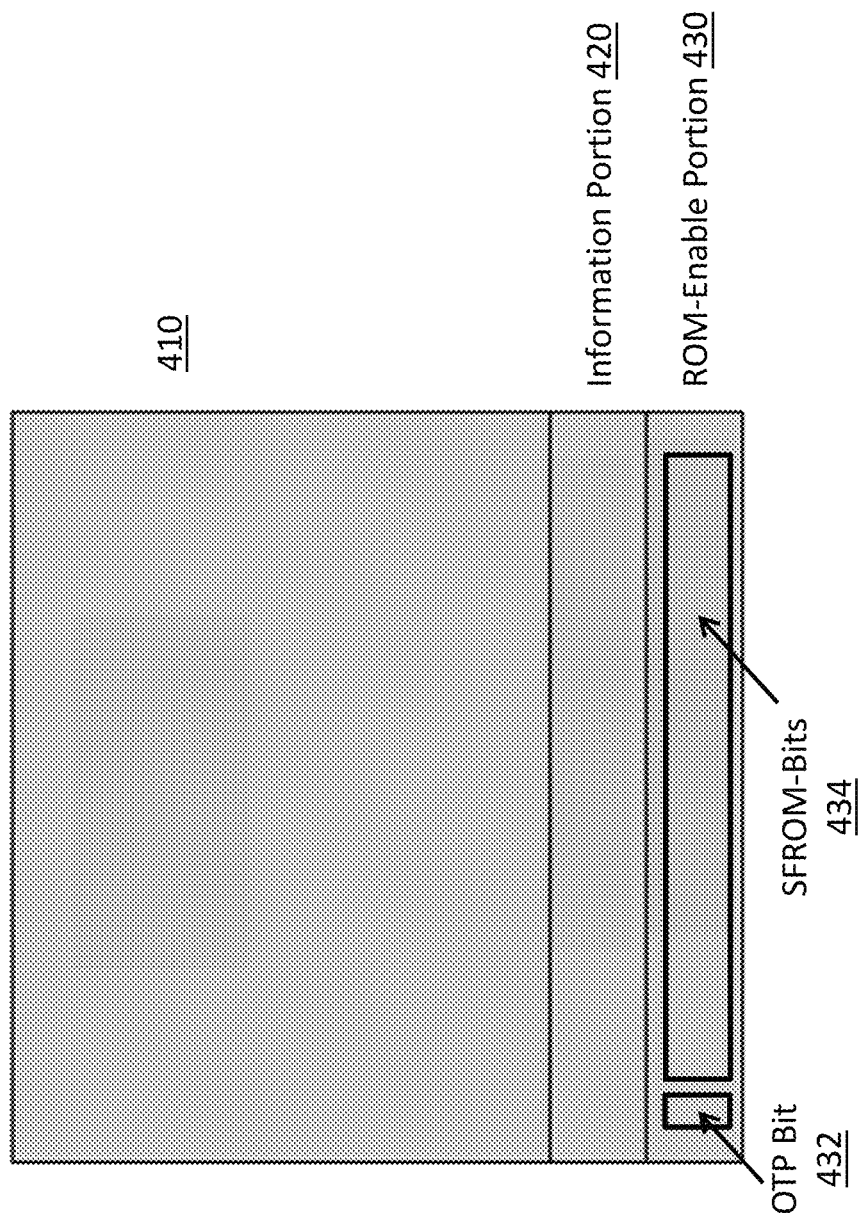
FIG. 4 depicts a flash memory array comprising an information portion and a ROM-enable portion.

FIG. 4 depicts memory array 215 from FIG. 2. It is to be understood that the same diagram can be used to describe memory array 220 or other memory arrays. Memory array 215 comprises a memory portion 410 comprising a first set of rows of memory cells, information portion 420 that comprises a second set of rows of memory cells, and ROM-enable portion 430 comprising a third set of rows of memory cells. ROM-enable portion 430 comprises an OTP bit 432 and SFROM-Bits 434. ROM-enable portion 430 can be viewed as a control portion of memory array 215.

Information portion 420 can be used to store information for a manufacturer or designer, for example, a known code that identifies the company that manufactured or designed the product.

SFROM-Bits 434 are used to identify the sectors of memory portion 410 that are to be used as read only memory. A sector of within memory array 215 consists of an even number of rows of memory cells, for example, 2, 4, or 8 rows of memory cells. All memory cells in a sector are erased at the same time. For example, if a particular bit in SFROM-Bits 434 is a "0," then the sector corresponding to that bit will be deemed a read-only sector, and erasing and programming that sector will be disabled. If a particular bit stores a "1," then the sector corresponding to that bit will be deemed a multiple-time programmable sector, and erasing and programming that sector will be enabled, and the sector will be accessible as normal flash memory. It is to be understood that the roles of the "0" and "1" values are exemplary and their roles can be switched if desired by the manufacturer.

OTP Bit 432 determines whether the ROM-Enable Portion 430 will itself be read only memory or can be erased and programmed. For example, if OTP Bit 432 is a "0," then ROM-Enable Portion 430 will be deemed a read-only portion, and erasing and programming that portion will be disabled. If OTP Bit 321 is a "1," then ROM-Enable Portion 430 will be deemed a multiple-time programmable sector, and erasing and programming that portion will be enabled.

Figure 5:
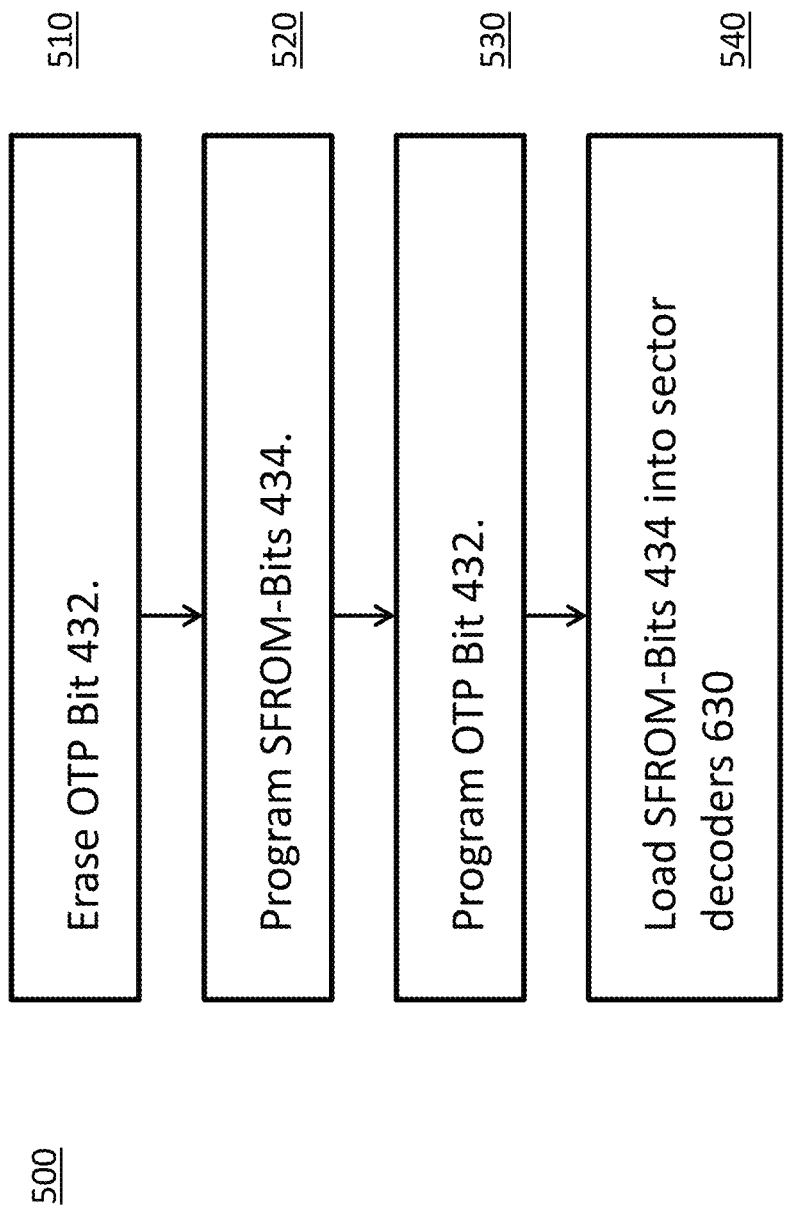
FIG. 5 depicts a method of using the ROM-enable portion.

FIG. 5 depicts programming method 500.

In step 510, OTP Bit 432 is erased, thereby enabling ROM-Enable Portion 430 to be enabled for programming.

In step 520, SFROM-Bit bits 434 are programmed. If a bit is programmed to "0," then the sector corresponding to that bit will be used as read only memory, and if the bit is progammed to "1," the sector corresponding to that bit will be used as flash memory.

In step 530, OTP Bit 432 is programmed to "1," thereby disabling ROM-Enable Portion 430 for further programming.

In step 540, SFROM-Bits 434 are loaded into sector decoders 630. The SFROM-Bits 434 thereby will enable or disable the erasing and programming of each sector, depending on the value of each bit.

SFROM-Bits 434 can be loaded into sector decoders 630 at various instances during operation of the system. Under one approach, SFROM-bits 434 can be loaded into sector decoders 630 when the system is powered up. In another embodiment of loading SFROM-bits 434 at power up, a data pattern check (read and verify fixed data) and/or a power integrity check (verify power level is able to reach a pre-determined level) ate done before SFROM-bits 434 are loaded. Under another approach, SFROM-Bits 434 for a particular sector also can be loaded into sector decoders 630 whenever an erase or program command is received for that particular sector. Under a third approach, SFROM-bits 434 also can be loaded into sector decoders 630 whenever ROM-Enable Portion 430 is erased or programmed. More than one of these approaches can be followed.

Figure 6:
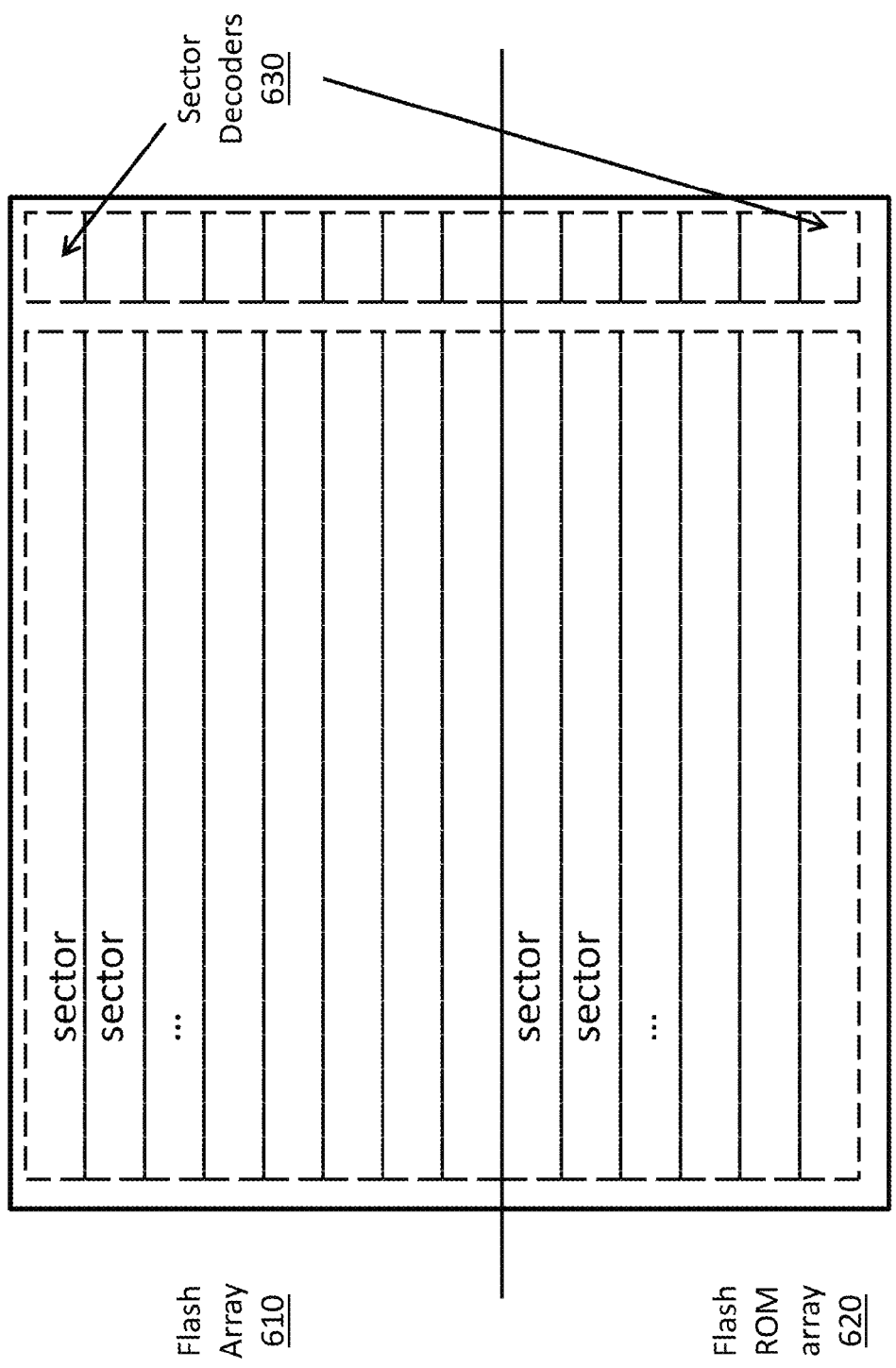
FIG. 6 depicts a memory array that is partitioned into a flash memory portion and a read only memory portion.

FIG. 6 depicts array 215. It is to be understood that the same diagram can be used to describe memory array 220 or other memory arrays. Array 215 is partitioned into a flash array 610 and a read only memory array 620, corresponding to the values of SFROM-bits 434. That is, flash array 610 is established through the setting of SFROM-bits 434 corresponding to those sectors to a certain value (e.g., "1"), and read only memory array 620 is established through the setting of SFROM-bits 434 to the opposite value (e.g., "0").

Sector decoders 630 will enable erasing and programming of the sectors in flash array 610 based on the values of the corresponding SFROM-bits 434, and will disable erasing and programming of the sectors in read only memory array 620 based on the values of the corresponding SFROM-bits 434. In this manner, array 215 can be partitioned into a flash portion (flash array 610) and a read only memory portion (flash ROM array 620). This can be useful, for example, to store important information on a flash memory chip that the manufacturer does not wish to be erased by a user (such as a BIOS, system information, file system information, security keys, etc.). Sector decoders optionally can be located in control logic 270 shown in FIG. 2.

Figure 7:
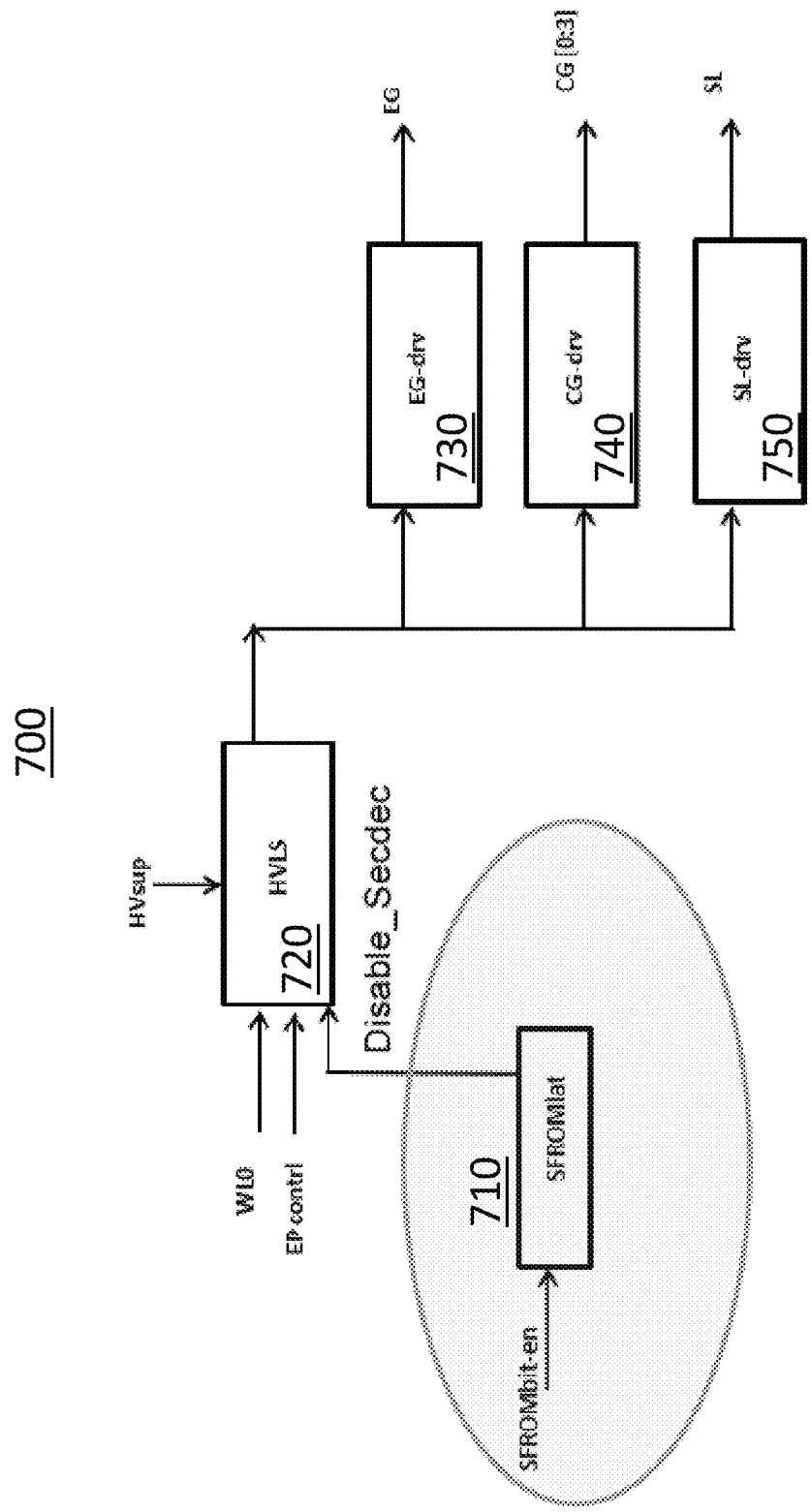
FIG. 7 depicts a sector decoder.

FIG. 7 depicts further detail of one sector decoder among sector decoders 630. It is to understood that the same design can be used for all of the sector decoders 630.

One of the SFROM-bits 434 is input to SFROM latch 710, which outputs and holds the value of the SFROM-bit 434. That output of latch 710 is sent into high voltage logic circuit 720, which also receives a high voltage supply, a word line, and and erase/program control line. The output of high voltage logic circuit 720 is input to erase gate driver 730 (which generates an erase gate signal applied to a sector of memory cells in memory array 215), control gate driver 740 (which generates a control gate signal applied to a sector of memory cells in memory array 215), and source line driver 750 (which generates a source line signal applied to a sector of memory cells in memory array 215). If the SFROM-bit 434 is set to a value that indicates read-only (e.g., "0"), then the erase gate, control gate, and source line output values will be set to allow only read operations and not erase or program operations using the voltage values described previously.

Figure 8A:
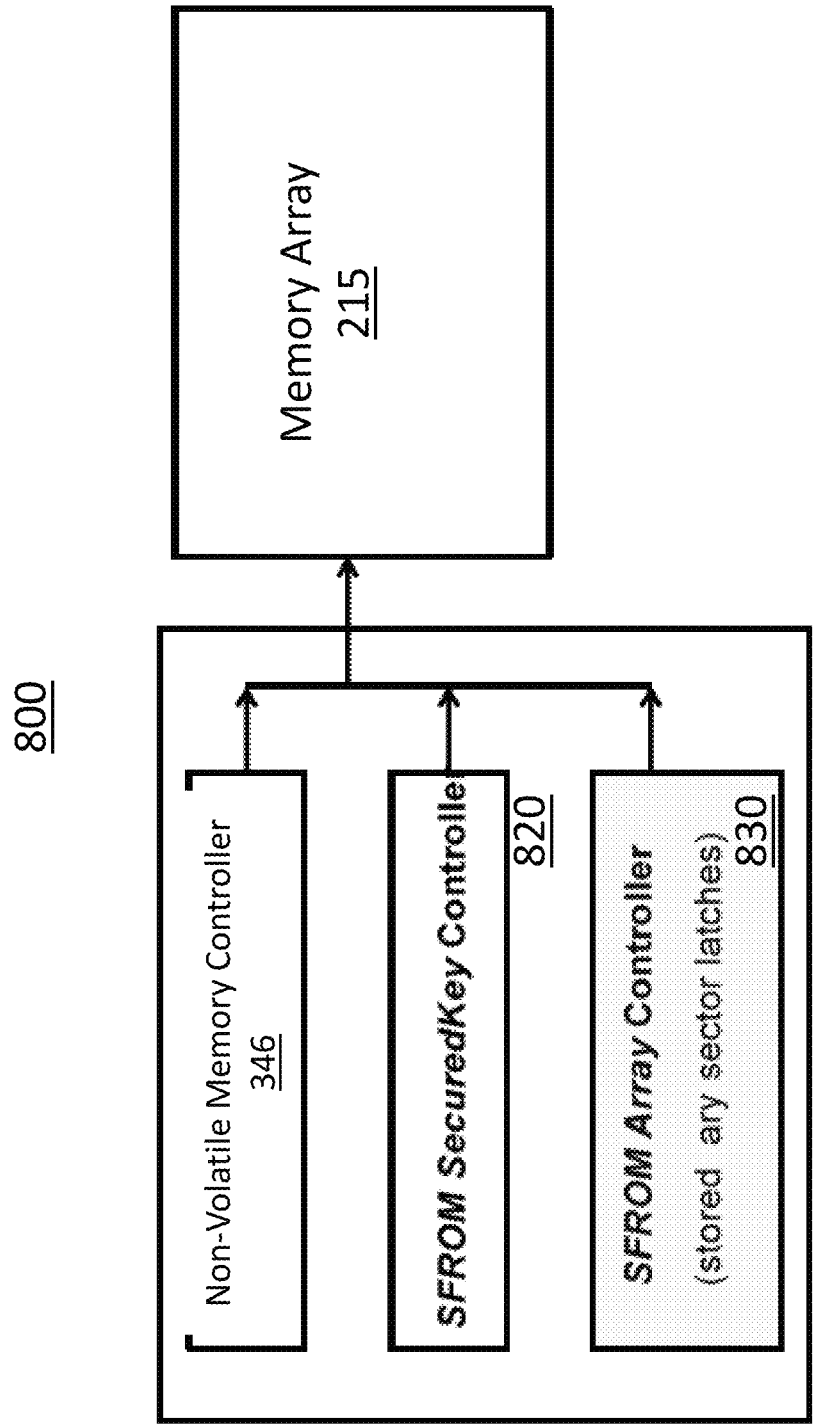
FIGS. 8A and 8B depict a SecuredKey controller.
Figure 8B:
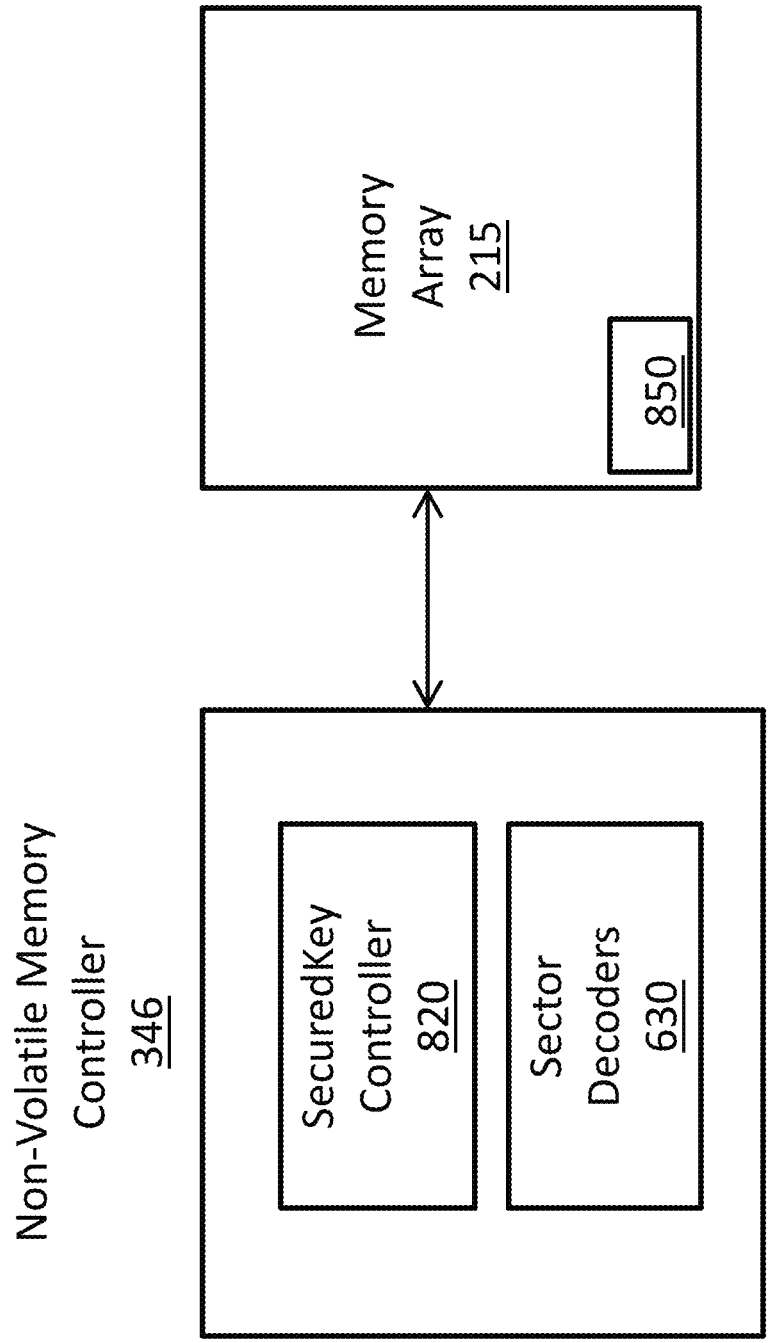

FIGS. 8A and 8B show a variation of the embodiments described thus far. In the embodiments of FIGS. 8A and 8B, the manufacturer or the user can establish SecuredKey 850 (a security key), which is stored in information portion 420, ROM-enable portion 430, or in some other location or device. SecuredKey 850 can be, for example, a 256 bit value. If the user correctly enters SecuredKey 850, the user will be allowed to change the contents of ROM-enable portion 430, thereby changing the configuration of memory array 215 and the relative sizes and boundaries of flash array 610 and flash ROM array 620. This can be useful, for example, if it is decided that additional space is needed in flash array 610 or flash ROM array 620.

In FIGS. 8A and 8B, non-volatile memory controller 346 comprises SecuredKey controller 820, which manages the operations of receiving data from a user, comparing the received data to SecuredKey 850, and enabling or preventing access to ROM-enable portion 430 as appropriate.

Figure 9:
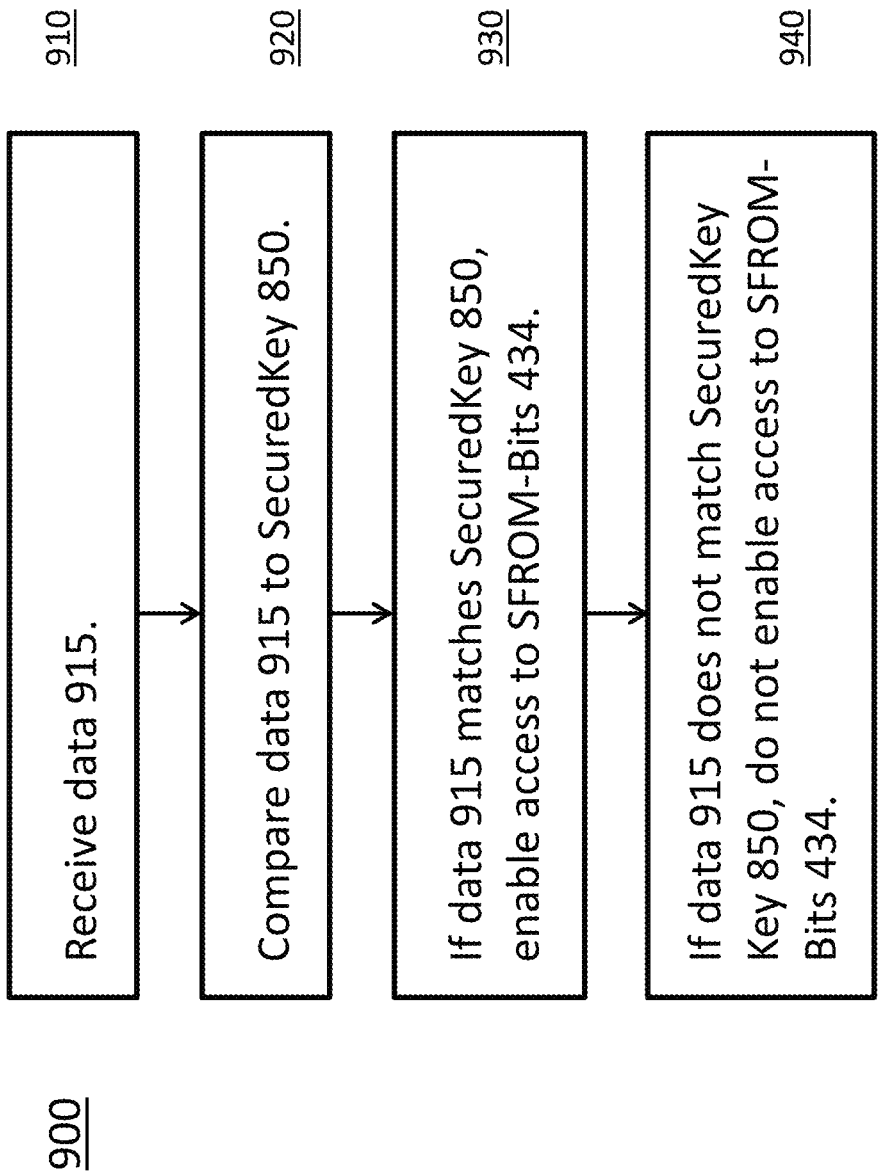
FIG. 9 depicts a security method for allowing access to the ROM-enable portion.

This is shown in FIG. 9, where security method 900 is depicted. In step 910, the user inputs data 915, which is the user's attempt to enter SecuredKey 850. In step 920, data 915 is compared to SecuredKey 850 stored in memory array 215. In step 930, if a match is found between data 915 and SecuredKey 850, the user is permitted to erase and/or program the ROM-Enable Portion 430 or just the SFROM-Bits 434. In step 940, if no match is found between data 915 and SecuredKey 850, the user is not given such access.

In the embodiment of FIGS. 8A, 8B, and 9, the user can be an ordinary user of the device, a manufacturer of the device, or a customer of the manufacturer who installs the device into another product and sells the product to an ordinary user. Access rights can be determined through the provision (or lack thereof) of SecuredKey 850

Figure 10:
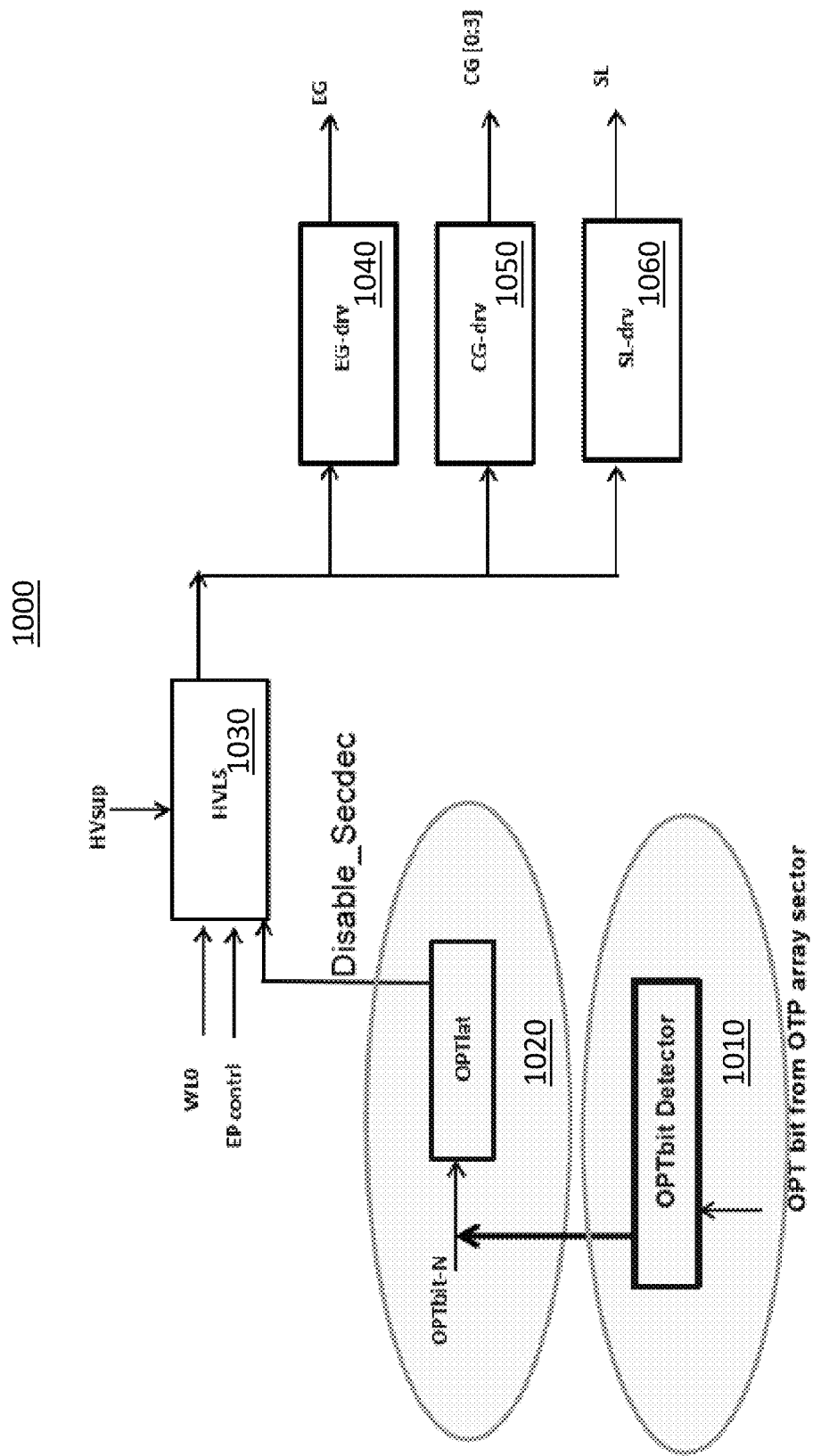
FIG. 10 depicts a decoder that is used for the ROM-enable portion.

In FIG. 10, one of the sector decoders 630, here labeled as sector decoder 1000, is depicted. Sector decoder 1000 is used to determine if ROM-enable portion 430 can itself be erased and programmed, or whether it is a read only memory portion. Detector 1010 receives OTP bit 432 from ROM-enable portion 430, latch 1020 latches the value and provides the value to high voltage logic circuit 1130, which also receives a high voltage supply, a word line, and an erase/program control line. The output of high voltage logic circuit 1030 is input to erase gate driver 1040 (which generates an erase gate signal applied to the memory cells of ROM-enable portion 430), control gate driver 1050 (which generates a control gate signal applied to the memory cells of ROM-enable portion 430), and source line driver 1060 (which generates a source line signal applied to the memory cells of ROM-enable portion 430). If the SFROM-bit 434 is set to a value that indicates read-only (e.g., "0"), then the erase gate, control gate, and source line output values will be set to allow only read operations and not erase or program operations using the voltage values described previously.

What is claimed is:

1. A non-volatile memory device comprising:
    an array of flash memory cells, the array comprising a first set of rows of flash memory cells and a second set of rows of flash memory cells;
    a first set of decoders configured to enable the first set of rows of flash memory cells to be erased and programmed; and
    a second set of decoders configured to prevent the second set of rows of flash memory cells from being erased and programmed;
    wherein the first set of decoders is responsive to a first set of bits stored in a control portion of the array.

2. The non-volatile memory device of claim 1, wherein a response to the first set of bits is stored in a latch in the first set of decoders.

3. The non-volatile memory device of claim 1, wherein the second set of decoders is responsive to a second set of bits stored in the control portion of the array.

4. The non-volatile memory device of claim 3, wherein a response to the second set of bits is stored in a latch in the second set of decoders.

5. The non-volatile memory device of claim 3, wherein the control portion contains one or more bits that indicate whether the control portion can be erased and programmed.

6. The non-volatile memory device of claim 5, wherein the first set of decoders sets voltages for an erase gate, a coupling gate, and a source line for the first set of rows of flash memory cells.

7. The non-volatile memory device of claim 6, wherein the second set of decoders sets voltages for an erase gate, a coupling gate, and a source line for the second set of rows of flash memory cells.

8. The non-volatile memory device of claim 3, wherein the first set of bits and the second set of bits are read from the control portion when the non-volatile memory device is powered up.

9. The non-volatile memory device of claim 3, wherein some of the first set of bits and the second set of bits are read from the control portion when an erase or program command is received.

10. The non-volatile memory device of claim 3, wherein the first set of bits and the second set of bits are read from the control portion after the control portion is programmed.

11. A non-volatile memory device comprising:
    an array of flash memory cells, the array comprising a first set of rows of flash memory cells and a second set of rows of flash memory cells;
    a first set of decoders configured to enable the first set of rows of flash memory cells to be erased and programmed;
    a second set of decoders configured to prevent the second set of rows of flash memory cells from being erased and programmed; and
    a control portion in the array and a control portion sector decoder associated with the control portion.

12. The non-volatile memory device of claim 11, wherein the control portion sector decoder comprises a latch to disable the erasing and programming of the control portion.

13. A method of operating a non-volatile memory device comprising an array of flash memory cells, the array comprising a first set of rows of flash memory cells and a second set of rows of flash memory cells, the method comprising:
    receiving, by a first set of decoders, a first set of bits from a control portion of the array;
    receiving, by a second set of decoders, a second set of bits from the control portion of the array;
    enabling, by the first set of decoders, the first set of rows of flash memory cells to be erased and programmed; and
    disabling, by the second set of decoders, the second set of rows of flash memory cells from being erased and programmed.

14. The method of claim 13, wherein the control portion contains one or more bits that indicate whether the control portion can be erased and programmed.

15. The method of claim 13, further comprising:
    setting, by the first set of decoders, voltages for an erase gate, a coupling gate, and a source line for the first set of rows of flash memory cells.

16. The method of claim 15, further comprising:
    setting, by the second set of decoders, voltages for an erase gate, a coupling gate, and a source line for the second set of rows of flash memory cells.

17. The method of claim 13, further comprising:
    reading the first set of bits and the second set of bits from the control portion when the non-volatile memory device is powered up.

18. The method of claim 13, further comprising:
    reading some of the first set of bits and the second set of bits from the control portion when an erase or program command is received.

19. The method of claim 13, further comprising:
    reading the first set of bits and the second set of bits from the control portion after the control portion is programmed.

20. The method of claim 13, wherein each of the flash memory cells is a non-volatile split gate memory cell.

21. The method of claim 13, wherein the second set of rows of flash memory cells is one time programmable.

22. The method of claim 21, wherein an OTP bit in an OTP sector in the array enables the second set of rows of flash memory cells to be one time programmable.

23. The method of claim 13, wherein the number of rows in the second set of rows of memory array is variable.

24. A non-volatile memory device comprising:
an array of flash memory cells, the array comprising a first set of rows of flash memory cells and a second set of rows of flash memory cells;
a first set of decoders configured to enable the first set of rows of flash memory cells to be erased and programmed in response to a first set of bits stored in a control portion of the array; and
a second set of decoders configured to prevent the second set of rows of flash memory cells from being erased and programmed in response to a second set of bits stored in the control portion of the array; and
a security circuit for enabling the control portion to be erased and programmed when a first set of data is received that matches a second set of data stored in the control portion.

25. The non-volatile memory device of claim 24, wherein the first set of decoders sets voltages for an erase gate, a coupling gate, and a source line for the first set of rows of flash memory cells.

26. The non-volatile memory device of claim 25, wherein the second set of decoders sets voltages for an erase gate, a coupling gate, and a source line for the second set of rows of flash memory cells.

27. The non-volatile memory device of claim 24, wherein the first set of bits and the second set of bits are read from the control portion when the non-volatile memory device is powered up.

28. The non-volatile memory device of claim 24, wherein some of the first set of bits and the second set of bits are read from the control portion when an erase or program command is received.

29. The non-volatile memory device of claim 24, wherein the first set of bits and the second set of bits are read from the control portion after the control portion is programmed.

30. The non-volatile memory device of claim 24, wherein each of the flash memory cells is a non-volatile split gate memory cell.

31. A method of operating a non-volatile memory device comprising an array of flash memory cells, the array comprising a first set of rows of flash memory cells and a second set of rows of flash memory cells, the method comprising:
receiving, by a first set of decoders, a first set of bits from a control portion of the array;
receiving, by a second set of decoders, a second set of bits from the control portion of the array;
enabling, by the first set of decoders, the first set of rows of flash memory cells to be erased and programmed;
disabling, by the second set of decoders, the second set of rows of flash memory cells from being erased and programmed; and
receiving, by a security circuit, a first set of data and enabling the control portion to be erased and programmed if the first set of data matches a second set of data stored in the control portion.

32. The method of claim 31, further comprising:
setting, by the first set of decoders, voltages for an erase gate, a coupling gate, and a source line for the first set of rows of flash memory cells.

33. The method of claim 32, further comprising:
setting, by the second set of decoders, voltages for an erase gate, a coupling gate, and a source line for the second set of rows of flash memory cells.

34. The method of claim 31, further comprising:
reading the first set of bits and the second set of bits from the control portion when the non-volatile memory device is powered up.

35. The method of claim 31, further comprising:
reading some of the first set of bits and the second set of bits from the control portion when the an erase or program command is received.

36. The method of claim 31, further comprising:
reading the first set of bits and the second set of bits from the control portion after the control portion is programmed.

37. The method of claim 31, wherein each of the flash memory cells is a non-volatile split gate memory cell.

38. The method of claim 31, wherein the second set of rows of flash memory cells is one time programmable.

39. The method of claim 38 wherein an OTP bit in an OTP sector in the array enables the second set of rows of flash memory cells to be one time programmable.

40. The method of claim 31, wherein the number of rows in the second set of rows of memory array is variable.

* * * * *